(12) United States Patent
Huang et al.

(10) Patent No.: US 12,414,395 B2
(45) Date of Patent: Sep. 9, 2025

(54) PHOTOSENSITIVE DEVICE

(71) Applicant: Au Optronics Corporation, Hsinchu (TW)

(72) Inventors: Yen-Tang Huang, Hsinchu (TW); Yan-Liang Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 540 days.

(21) Appl. No.: 17/722,409

(22) Filed: Apr. 18, 2022

(65) Prior Publication Data

US 2022/0375979 A1 Nov. 24, 2022

Related U.S. Application Data

(60) Provisional application No. 63/224,977, filed on Jul. 23, 2021, provisional application No. 63/189,960, filed on May 18, 2021.

(30) Foreign Application Priority Data

Dec. 2, 2021 (TW) ................................ 110144977

(51) Int. Cl.
   *H10F 39/00* (2025.01)
   *G02B 27/30* (2006.01)
   *G06V 40/13* (2022.01)

(52) U.S. Cl.
   CPC ......... *H10F 39/8063* (2025.01); *G02B 27/30* (2013.01); *H10F 39/8053* (2025.01); *G06V 40/1318* (2022.01)

(58) Field of Classification Search
   CPC ........ H01L 27/14621; H01L 27/14627; G02B 27/30; G02B 3/0062; G06V 40/1318; H10F 39/8053; H10F 39/8063
   See application file for complete search history.

(56) References Cited

U.S. PATENT DOCUMENTS

2005/0061950 A1\* 3/2005 Jiang .................... H10F 39/8063
  250/214.1
2005/0274968 A1\* 12/2005 Kuo ..................... H10F 39/8053
  257/98

(Continued)

FOREIGN PATENT DOCUMENTS

| CN | 108681703 | 10/2018 |
| CN | 112882279 | 6/2021 |
| JP | 2007047569 | 2/2007 |

*Primary Examiner* — Meiya Li
(74) *Attorney, Agent, or Firm* — JCIPRNET

(57) ABSTRACT

A photosensitive device includes a first substrate, a second substrate, a supporting structure, multiple first microlenses, multiple second microlenses, a first photosensitive element, a second photosensitive element, and a collimating structure. The second substrate is opposite to the first substrate, and there is a gap between the first substrate and the second substrate. The supporting structure is located in the gap between the first substrate and the second substrate. The first microlenses and the second microlenses are respectively disposed on a first side and a second side of the gap. The first photosensitive element is overlapping with one of the first microlenses and one of the second microlenses. The second photosensitive element is overlapping with another one of the second microlenses. The collimating structure is located between the first substrate and the first microlenses.

17 Claims, 6 Drawing Sheets

(56) References Cited

U.S. PATENT DOCUMENTS

| 2012/0170072 | A1 | 7/2012 | Miyazaki et al. |
| 2019/0278152 | A1* | 9/2019 | Wang ................ G02F 1/133526 |
| 2020/0203532 | A1* | 6/2020 | Yamazaki ............... G02F 1/136 |
| 2021/0286963 | A1 | 9/2021 | Gao et al. |

* cited by examiner

PHOTOSENSITIVE DEVICE

CROSS-REFERENCE TO RELATED APPLICATION

This application claims the priority benefit of U.S. provisional application Ser. No. 63/189,960, filed on May 18, 2021, U.S. provisional application Ser. No. 63/224,977, filed on Jul. 23, 2021, and Taiwan application serial no. 110144977, filed on Dec. 2, 2021. The entirety of each of the above-mentioned patent applications is hereby incorporated by reference herein and made a part of this specification.

BACKGROUND

Technical Field

The disclosure relates to a photosensitive device, and more particularly, to a photosensitive device having a microlens.

Description of Related Art

In order to increase a screen-to-body ratio of a display to achieve a narrow border design, the fingerprint on display sensing technology has become a trend. To put it simply, the fingerprint on display sensing technology is to dispose a photosensitive device under a display panel of an electronic device. After the electronic device detects that a user touches a display screen, the electronic device controls the display panel to emit light to illuminate a surface of a finger of the user. The sensing light is reflected (diffused) by the finger of the user into the photosensitive device under the display panel, and the reflected light is converged on a photosensitive element through multiple microlenses and a collimating structure to be converted into a digital image signal, which may obtain a fingerprint image of the user.

Generally speaking, if a color image is to be recognized, the photosensitive element for receiving the light having different wavelengths is usually required to be disposed in the photosensitive device. However, in the same material, the light having different wavelengths has different refractive indices. Specifically, the longer the wavelength of the light, the less the refractive index in a medium. As a result, the light of different colors has different focus depths in the photosensitive device, and the image recognition and light collecting ability of the photosensitive device is deteriorated.

SUMMARY

The disclosure provides a photosensitive device with good image sensing quality.

At least one embodiment of the disclosure provides a photosensitive device, including a first substrate, a second substrate, a supporting structure, multiple first microlenses, multiple second microlenses, a first photosensitive element, a second photosensitive element, and a collimating structure. The second substrate is opposite to the first substrate, and there is a gap between the first substrate and the second substrate. The support supporting is located in the gap between the first substrate and the second substrate. The first microlenses and the second microlenses are respectively disposed on a first side and a second side of the gap. The first photosensitive element is overlapping with one of the first microlenses and one of the second microlenses. The second photosensitive element is overlapping with another one of the second microlenses. The collimating structure is located between the first substrate and the first microlens.

At least one embodiment of the disclosure provides a photosensitive device including a first substrate, a second substrate, multiple first microlenses, multiple second microlenses, a first photosensitive element, and a second photosensitive element. The second substrate is opposite to the first substrate, and there is a gap between the first substrate and the second substrate. The first microlenses and the second microlenses are respectively disposed on a first side and a second side of the gap. A material of the first microlenses is different from a material of the second microlenses, and/or a radius of curvature of the first microlenses is different from a radius of curvature of the second microlenses. The first photosensitive element is overlapping with one of the first microlenses. The second photosensitive element is overlapping with one of the second microlenses, and is not overlapping with the first microlenses.

DETAILED DESCRIPTION OF DISCLOSED EMBODIMENTS

Figure 1:
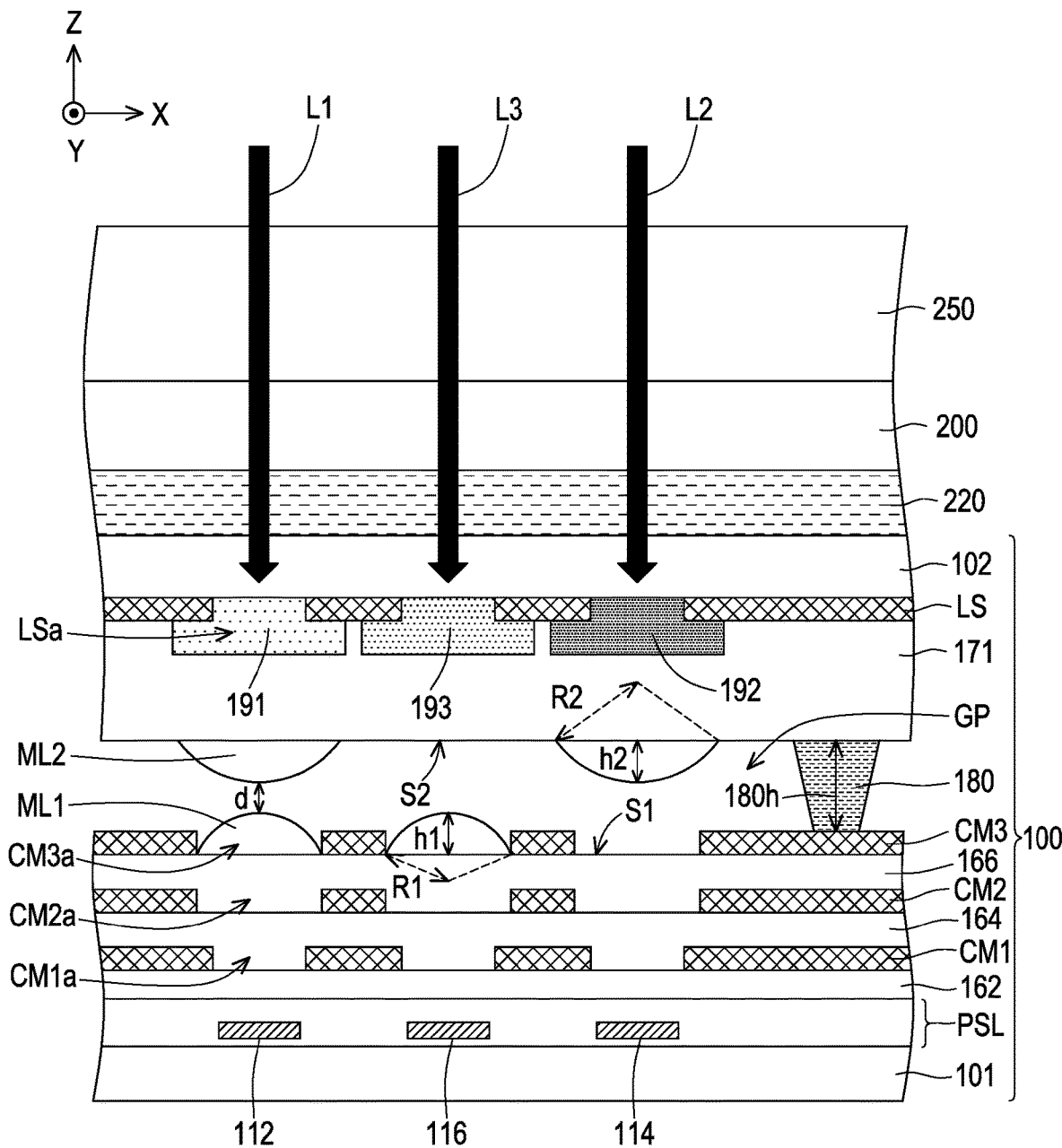
FIG. 1 is a schematic cross-sectional view of a display device according to an embodiment of the disclosure.

The term "about", "approximately", "essentially" or "substantially" used herein includes the value and an average value within an acceptable deviation range of specific values determined by a person of ordinary skill in the art, taking into account discussed measurements and a specific number of measurement-related errors (i.e., limitations of a measuring system). For example, the term "about" may mean being within one or more standard deviations of the value, or within, for example, ±30%, ±20%, ±10%, and ±5%. Moreover, the term "about", "approximately", "essentially" or "substantially" used herein may mean selecting a more acceptable deviation range or standard deviations according to measurement properties, cutting properties or other properties, without applying a single standard deviation to all properties.

In the accompanying drawings, thicknesses of layers, films, panels, regions, etc., are enlarged for clarity. It should be understood that when an element such as the layer, film, region, or substrate is described as being "on" or "connected to" another element, it may be directly on or connected to another element, or there may be an intervening element therebetween. In contrast, when an element is described as being "directly on" or "directly connected to" another element, there are no intervening elements therebetween. As used herein, "connected" may refer to a physical and/or electrical connection. Furthermore, "electrically connected" may refer to the existence of other elements between the two elements.

Reference will now be made in detail to the exemplary embodiments of the disclosure, and examples of the exemplary embodiments are illustrated in the accompanying drawings. Whenever possible, the same reference numerals are used in the drawings and descriptions to indicate the same or similar parts.

Figure 2:
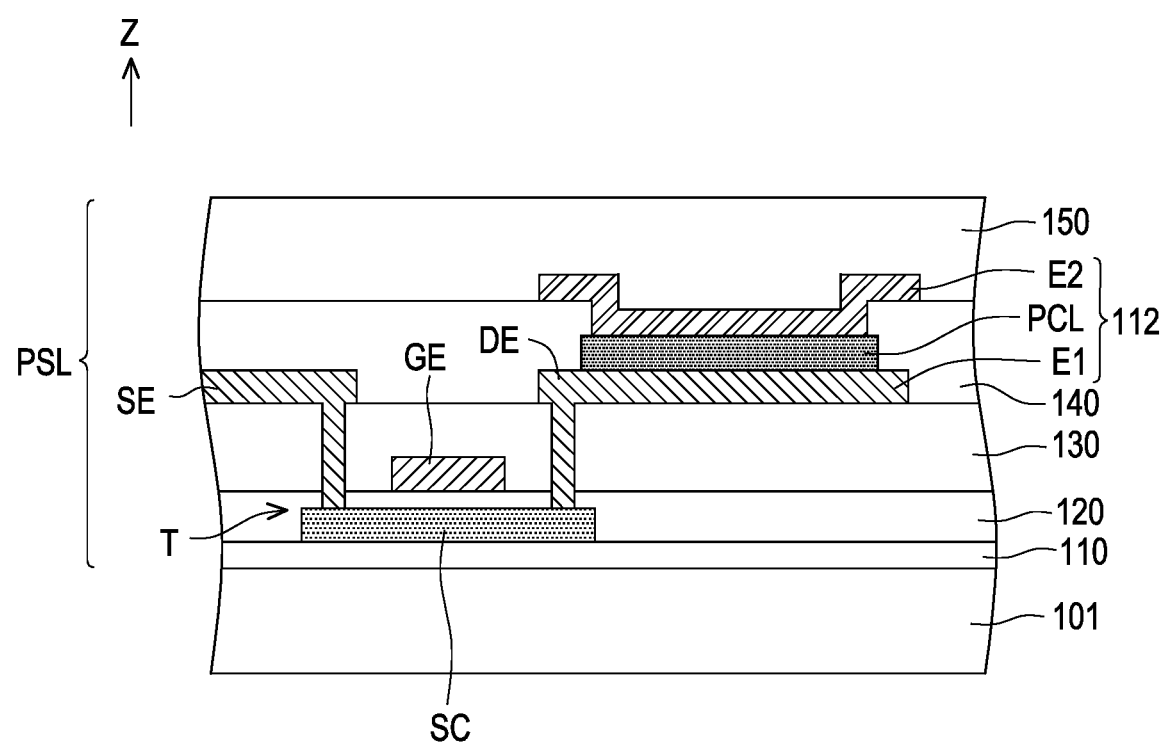
FIG. 2 is a schematic partial enlarged view of a photosensitive device of FIG. 1.

FIG. 1 is a schematic cross-sectional view of a display device according to an embodiment of the disclosure. FIG. 2 is a schematic partial enlarged view of a photosensitive device of FIG. 1.

Referring to FIGS. 1 and 2, a display device 10 includes a photosensitive device 100, a display panel 200, and a cover plate 250 that are disposed on top of one another. For example, the photosensitive device 100 and the display panel 200 are bonded together by an optical adhesive layer 220 distributed over an entire surface. A material of the optical adhesive layer 220 includes, for example, an optical clear resin (OCR), an optical clear adhesive (OCA), a pressure sensitive adhesive (PSA), or other suitable adhesive materials.

In this embodiment, the photosensitive device 100 may be disposed on a back side of the display panel 200. For example, the photosensitive device 100 is a fingerprint recognition module, and the display device 10 may be a fingerprint on display recognition device. However, the disclosure is not limited thereto.

The display panel 200 is, for example, an organic light emitting diode (OLED) panel, a micro light emitting diode (micro-LED) panel, a mini light emitting diode (mini-LED) panel, or other suitable self-luminous display panels. It is particularly noted that in this embodiment, the display panel 200 may also be used as an illumination light source for fingerprint recognition. However, the disclosure is not limited thereto. In other embodiments, the display panel may also be a non-self-luminous display panel (e.g., a liquid crystal display panel), and the display device uses a backlight source to provide illumination light required for the fingerprint recognition.

The photosensitive device 100 includes a first substrate 101, a second substrate 102, a supporting structure 180, multiple first microlenses ML1, multiple second microlenses ML2, a photosensitive element layer PSL, and a first collimating structure CM1. In this embodiment, the photosensitive device 100 further includes a second collimating structure CM2, a third collimating structure CM3, a light shielding pattern layer LS, a first filter element 191, a second filter element 192, and a third filter element 193.

The first substrate 101 includes a transparent or opaque substrate. For example, the first substrate 101 includes glass, quartz, organic polymers, opaque/reflective materials (e.g., conductive materials, metals, wafers, ceramics, or other applicable materials), or other applicable materials. If the conductive materials or metals are used, an insulating layer (not shown) is covered on the first substrate 101 to avoid an issue of short circuit.

The photosensitive element layer PSL is located above the first substrate 101 and includes multiple active elements and multiple photosensitive elements. In FIG. 1, a first photosensitive element 112, a second photosensitive element 114, and a third photosensitive element 116 in the photosensitive element layer PSL are shown, and the active elements electrically connected to the first photosensitive element 112, the second photosensitive element 114, and the third photosensitive element 116 are omitted. In some embodiments, the first photosensitive element 112, the second photosensitive element 114, and the third photosensitive element 116 are formed together, and the first photosensitive element 112, the second photosensitive element 114, and the third photosensitive element 116 all have the same vertical distance from the first substrate 101. In other words, in some embodiments, based on a surface of the first substrate 101, the first photosensitive element 112, the second photosensitive element 114, and the third photosensitive element 116 are located at the same level height.

The first photosensitive element 112, the second photosensitive element 114, and the third photosensitive element 116 are respectively electrically connected to the corresponding active elements. In order to illustrate the electrical connection between the photosensitive elements and the active elements, in FIG. 2, the first photosensitive element 112 is taken as an example for illustration, and the second photosensitive element 114 and the third photosensitive element 116 are also electrically connected to the corresponding active elements in the same manner as in FIG. 2.

Referring to FIG. 2, the first photosensitive element 112 (which may also be the second photosensitive element 114 or the third photosensitive element 116) is electrically connected to an active element T. The active element T has a source SE, a drain DE, a gate GE, and a semiconductor pattern SC. In this embodiment, the semiconductor pattern SC is a single-layer or multi-layer structure, which includes amorphous silicon, polycrystalline silicon, microcrystalline silicon, single crystal silicon, organic semiconductor materials, oxide semiconductor materials (e.g., indium zinc oxide, indium gallium zinc oxide, other suitable materials, or a combination of the above), other suitable materials, or a combination of the above, but the disclosure is not limited thereto. The semiconductor pattern SC is located on the first substrate 101. In this embodiment, a buffer layer 110 is selectively disposed between the semiconductor pattern SC and the first substrate 101. The gate GE is overlapping with the semiconductor pattern SC, and a gate insulating layer 120 is sandwiched between the gate GE and the semiconductor pattern SC. In this embodiment, the gate GE may be selectively disposed above the semiconductor pattern SC to form a top-gate thin film transistor, but the disclosure is not limited thereto. In other embodiments, the gate GE may also be disposed under the semiconductor pattern SC to form a bottom-gate thin film transistor. An interlayered insulating layer 130 is located on the gate GE and the gate insulating layer 120. The source SE and the drain DE are located on the interlayered insulating layer 130, and are electrically connected to the semiconductor pattern SC.

A planar layer 140 is located on the interlayered insulating layer 130. The first photosensitive element 112 (which may also be the second photosensitive element 114 or the third photosensitive element 116) is located on the interlayered insulating layer 130, and is electrically connected to the drain DE of the active element T. In this embodiment, the first photosensitive element 112 (which may also be the second photosensitive element 114 or the third photosensitive element 116) includes a first electrode E1, a photoelectric conversion layer PCL, and a second electrode E2. The photoelectric conversion layer PCL has a single-layer or multi-layer structure. For example, the photoelectric conversion layer PCL is silicon-rich oxide (SRO). In other embodiments, the photoelectric conversion layer PCL is a stacked layer of a P-type semiconductor, an intrinsic semiconductor, and an N-type semiconductor. A planar layer 150 is located on the second electrode E2.

Continuing to refer to FIG. 1, the first collimating structure CM1, the second collimating structure CM2, and the third collimating structure CM3 are located above the first substrate 101. The first collimating structure CM1 has multiple first voids CM1a corresponding to the photosensitive elements (including the first photosensitive element 112, the second photosensitive element 114, and the third photosensitive element 116). The second collimating structure CM2 has multiple second voids CM2a corresponding to the photosensitive elements. The third collimating structure CM3 has multiple third voids CM3a corresponding to the photosensitive elements. The first voids CM1a, the second voids CM2a, and third voids CM3a overlap in a direction Z. In this embodiment, the voids may be arranged in an array, for example, respectively arranged in multiple columns and multiple rows along a direction X and a direction Y, but the disclosure is not limited thereto.

In this embodiment, a planar layer 162 is located on the photosensitive element layer PSL, and the first collimating structure CM1 is located on the planar layer 162. A planar layer 164 is located on the first collimating structure CM1, and the second collimating structure CM2 is located on the planar layer 164. A planar layer 166 is located on the second collimating structure CM2, and the third collimating structure CM3 is located on the planar layer 166.

The first microlenses ML1 are disposed on the first substrate 101. The first collimating structure CM1 and the second collimating structure CM2 are located between the first substrate 101 and the first microlenses ML1.

In this embodiment, the first microlenses ML1 may be arranged in multiple columns and multiple rows along the direction X and the direction Y. In this embodiment, some of the third voids CM3a are provided with the first microlenses ML1, while the other third voids CM3a are not provided with the first microlenses ML1. Therefore, in this embodiment, some photosensitive elements (e.g., the first photosensitive element 112 and the third photosensitive element 116) are overlapping with the first microlenses ML1 in the direction Z, while some photosensitive elements (e.g., the second photosensitive element 114) are not overlapping with the first microlenses ML1 in the direction Z.

In some embodiments, the first microlenses ML1 may be formed by organic photoresist materials, but the disclosure is not limited thereto.

The second substrate 102 is opposite to the first substrate 101. The second substrate 102 includes a transparent substrate. For example, the second substrate 102 includes glass, quartz, organic polymers, or other applicable materials.

The light shielding pattern layer LS is disposed on the second substrate 102. For example, the light shielding pattern layer LS is disposed between the second substrate 102 and the first substrate 101. The light shielding pattern layer LS has multiple voids LSa. In this embodiment, the voids LSa of the light shielding pattern layer LS are overlapping with the first voids CM1a, the second voids CM2a, and the third voids CM3a in the direction Z.

The first filter element 191, the second filter element 192, and the third filter element 193 are disposed on the second substrate 102. For example, the first filter element 191, the second filter element 192, and the third filter element 193 are disposed between the second substrate 102 and the first substrate 101, and are respectively filled in the corresponding voids LSa.

The first filter element 191 is overlapping with the first photosensitive element 112, and is configured to enable a light L1 having a first wavelength λ1 to pass through. The second filter element 192 is overlapping with the second photosensitive element 114, and is configured to enable a light L2 having a second wavelength λ2 to pass through. The third filter element 193 is overlapping with the third photosensitive element 116, and is configured to enable a light L3 having a third wavelength λ3 to pass through.

In this embodiment, the first wavelength λ1 is greater than the third wavelength λ3, and the third wavelength λ3 is greater than the second wavelength λ2, but the disclosure is not limited thereto. In other embodiments, the first wavelength λ1 is greater than the second wavelength λ2, and the second wavelength λ2 is greater than the third wavelength λ3. In some embodiments, the light L1, the light L2, and the light L3 are visible light, such as green light, blue light, and red light, but the disclosure is not limited thereto. In other embodiments, the light L1, the light L2, and the light L3 may also include non-visible light, such as infrared light.

In some embodiments, the first filter element 191, the second filter element 192, and the third filter element 193 are disposed to convert the light into the light having the predetermined wavelength, but the disclosure is not limited thereto. In other embodiments, the first filter element 191, the second filter element 192, and the third filter element 193 are not required to be disposed, and the light having the predetermined wavelength may be obtained by selecting a light source that may emit the light having the predetermined wavelength.

A cladding layer 171 is disposed on the first filter element 191, the second filter element 192, and the third filter element 193.

The second microlenses ML2 are disposed on the second substrate 102. At least one of the first filter element 191, the second filter element 192, and the third filter element 193 is located between the second substrate 102 and the second microlenses ML2.

In this embodiment, the second microlenses ML2 may be disposed in multiple columns and multiple rows along the direction X and the direction Y. In this embodiment, some photosensitive elements (e.g., the second photosensitive element 114 and the first photosensitive element 112) are overlapping with the second microlenses ML2 in the direction Z, and some photosensitive elements (e.g., the third photosensitive element 116) are not overlapping with the second microlenses ML2 in the direction Z.

In some embodiments, the second microlenses ML2 may be formed by the organic photoresist materials, but the disclosure is not limited thereto.

In this embodiment, there is a gap GP between the first substrate 101 and the second substrate 102, and the gap GP is, for example, an air gap. The supporting structure 180 is located in the gap GP between the first substrate 101 and the second substrate 102. It may also be said that a thickness of the gap GP between the first substrate 101 and the second substrate 102 is defined by a thickness of the supporting structure 180. In this embodiment, the supporting structure 180 is used to support the gap GP between the first substrate 101 and the second substrate 102, so as to prevent the gap GP between the first substrate 101 and the second substrate 102 from collapsing.

In some embodiments, a height 180h of the supporting structure 180 is greater than or equal to a sum of a height h1 of the first microlenses ML1 and a height h2 of the second microlenses ML2, but the disclosure is not limited thereto. In other embodiments, the dummy first microlenses ML1 are disposed below the supporting structure 180, and the supporting structure 180 is located on the dummy first microlenses ML1. At this time, the height 180h of the supporting structure 180 is greater than or equal to the height h2 of the second microlenses ML2. In some embodiments, a thickness of the third collimating structure CM3 is relatively thin and thus may be omitted.

The first microlenses ML1 and the second microlenses ML2 are respectively disposed on a first side S1 and a second side S2 of the gap GP. In this embodiment, the first side S1 of the gap GP is a side of the gap GP close to the first substrate 101, and the second side S2 is a side of the gap GP close to the second substrate 102. In other words, the first microlenses ML1 are disposed on the side of the gap GP close to the first substrate 101, and the second microlenses ML2 are disposed on the side of the gap GP close to the second substrate 102. In other embodiments, positions of the first microlenses ML1 and the second microlenses ML2 may be interchanged with one another.

In this embodiment, the first photosensitive element 112 is overlapping with one of the first microlenses ML1 and one of the second microlenses ML2 in the direction Z. The second photosensitive element 114 is overlapping with one of the second microlenses ML2 in the direction Z, and is not overlapping with the first microlenses ML1. The third photosensitive element 116 is overlapping with one of the first microlenses ML1 in the direction Z, and is not overlapping with the second microlenses ML2.

In this embodiment, the first microlenses ML1 and the second microlenses ML2 are convex lenses, and a focus length of the convex lens may be calculated by Formula 1.

$$\frac{1}{f} = \frac{(n-1)}{nR} \qquad \text{Formula 1}$$

In Formula 1, f is a focal length of the microlens; n is a refractive index, and R is a radius of curvature of the microlens.

In this embodiment, the light L1, the light L2, and the light L3 each have different wavelengths. The longer the wavelength of the light, the less the refractive index n in the medium, and the easier it is to be focused at a deeper position. In this embodiment, since a radius of curvature R1 of the first microlenses ML1 is different from a radius of curvature R2 of the second microlenses ML2, the light L1 and the light L2 are prevented from being focused at the position with different depths. Specifically, in this embodiment, the third wavelength λ3 of the light L3 is greater than the second wavelength λ2 of the light L2. Therefore, when a material of the first microlenses ML1 is the same as a material of the second microlenses ML2, a refractive index n3 of the light L3 in the first microlenses ML1 is less than a refractive index n2 of the light L2 in the second microlenses ML2. The radius of curvature R2 of the second microlenses ML2 is greater than the radius of curvature R1 of the first microlenses ML1, so as to improve an issue that the focus position of the light L3 is deeper than the focus position of the light L2 due to the refractive index n3 being less than the refractive index n2. In this embodiment, the light L3 passing through the first microlenses ML1 is focused at a position of the third photosensitive element 116, and the light L2 passing through the second microlenses ML2 is focused at a position of the second photosensitive element 114.

In addition, when the first microlenses ML1 and the second microlenses ML2 are combined together, the focus length may be calculated by Formula 2.

$$\frac{1}{f} = \frac{1}{f_1} + \frac{1}{f_2} - \frac{d}{f_1 f_2} \qquad \text{Formula 2}$$

In Formula 2, f is the focal length after the first microlenses ML1 and the second microlenses ML2 are combined together; f1 is the focal length of the first microlenses ML1; f2 is the focal length of the second microlenses ML2, and d is a vertical spacing between the first microlenses ML1 and the second microlenses ML2. In this embodiment, d is much less than f1 and f2, or even d is equal to 0. Therefore, d/f1 f2 approaches 0. For example, d is less than 1 micrometer, and f1 and f2 are respectively 10 micrometers to 25 micrometers. Therefore, Formula 2 may be further omitted to be Formula 3.

$$\frac{1}{f} = \frac{1}{f_1} + \frac{1}{f_2} \qquad \text{Formula 3}$$

In this embodiment, the first wavelength λ1 of the light L1 is greater than the third wavelength λ3 of the light L3 and the second wavelength λ2 of the light L2. Therefore, when the material of the first microlenses ML1 is the same as the material of the second microlenses ML2, a refractive index n1 of the light L1 in the first microlenses ML1 or the second microlenses ML2 is less than the refractive index n3 of the light L3 in the first microlenses ML1 and the refractive index n2 of the light L2 in the second microlenses ML2. The first microlenses ML1 are overlapping with the second microlenses ML2, so as to improve an issue that the focus position of the light L1 is too deep due to the first wavelength λ1 being greater than the third wavelength λ3 and the second wavelength λ2. In this embodiment, the light L1 passing through the first microlenses ML1 and the second microlenses ML2 is focused at a position of the first photosensitive element 112.

Based on the above, by disposing the first microlenses ML1 and the second microlenses ML2, the light L1, the light L2, and the light L3 may be respectively focused at the positions of the first photosensitive element 112, the second photosensitive element 114, and the third photosensitive element 116, thereby enhancing the image sensing quality. In addition, all the first microlenses ML1 are formed on the same layer by the same process, and all the second microlenses ML2 are formed on the same layer by another same process. In other words, in this embodiment, the first microlenses ML1 and the second microlenses ML2 having different radii of curvature are respectively formed in different layers, which may have a lower manufacturing cost compared with forming the first microlenses ML1 and the second microlenses ML2 having different radii of curvature in the same layer.

In addition, although in FIG. 1, the photosensitive device 100 is configured to receive the light L1, the light L2, and the light L3 having three different wavelengths, the disclosure is not limited thereto. In other embodiments, the photosensitive device is configured to receive at least two of the light L1, the light L2, and the light L3. In other words, in other embodiments, a method of disposing the microlenses includes at least two of the photosensitive elements overlapping with both the first microlenses ML1 and the second microlenses ML2, the photosensitive elements only overlapping with the first microlenses ML1, and the photosensitive elements only overlapping with the second microlenses ML2. In other words, the disclosure does not limit the photosensitive device 100 to have the three features of the photosensitive elements overlapping with both the first microlenses ML1 and the second microlenses ML2, the photosensitive elements only overlapping with the first microlenses ML1, and the photosensitive elements only overlapping with the second microlenses ML2 at the same time.

Figure 3:
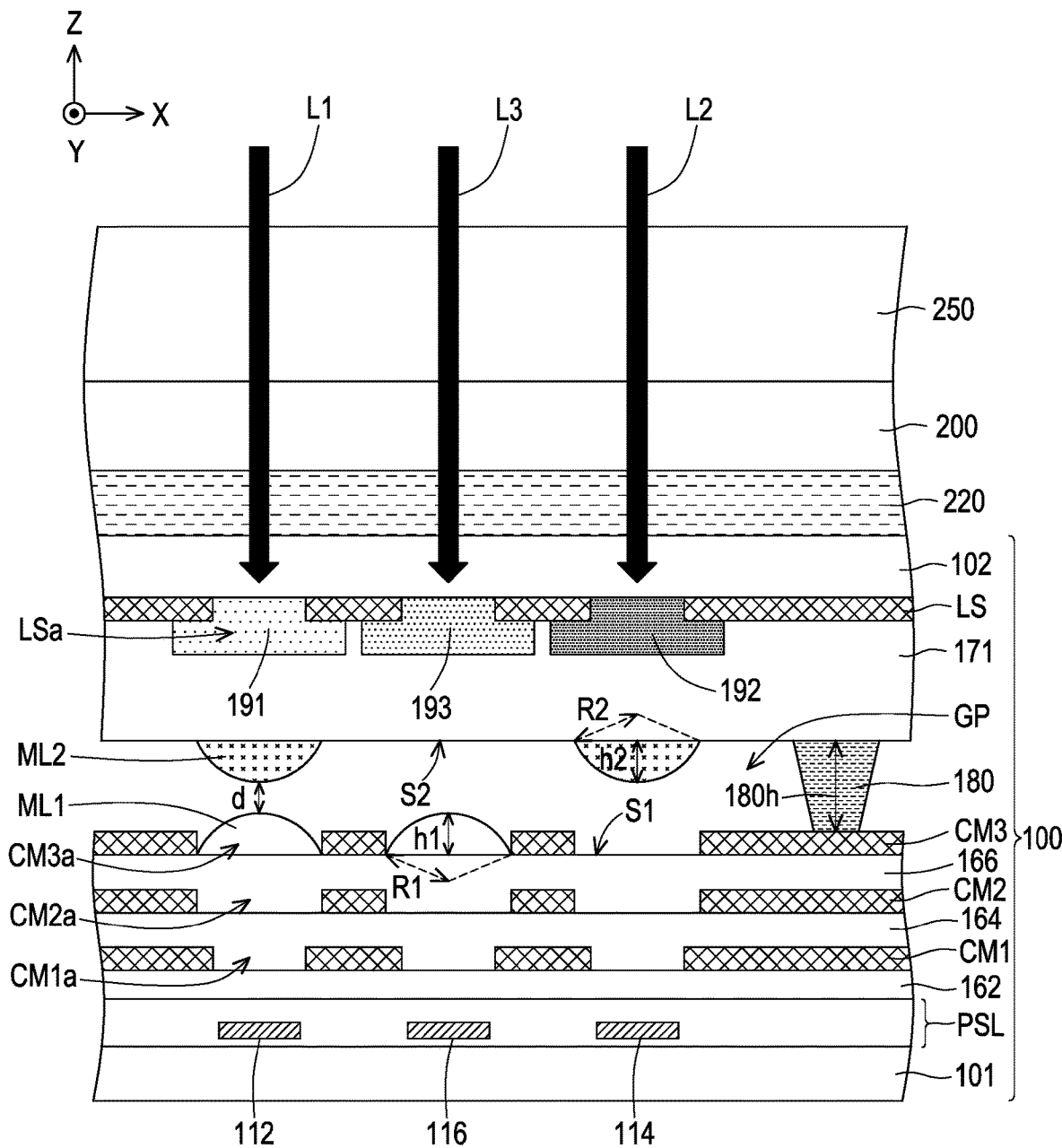
FIG. 3 is a schematic cross-sectional view of a display device according to an embodiment of the disclosure.

FIG. 3 is a schematic cross-sectional view of a display device according to an embodiment of the disclosure. It is noted that some of the reference numerals and descriptions of the embodiment of FIG. 1 will apply to the embodiment of FIG. 3. The same or similar reference numerals will represent the same or similar elements, and the descriptions of the same technical contents will be omitted. Reference may be made to the above embodiment for the omitted descriptions, which will not be repeated in the following embodiments.

A difference between a display device 20 of FIG. 3 and the display device 10 of FIG. 1 is that in the display device 20, the radius of curvature R1 of the first microlenses ML1 is equal to the radius of curvature R2 of the second microlenses ML2, and the material of the first microlenses ML1 is different from the material of the second microlenses ML2.

In some embodiments, the material of the first microlenses ML1 is adjusted to increase a refractive index n3' of the light L3 in the first microlenses ML1 (e.g., greater than the refractive index n3 of the light L3 in the first microlenses ML1 in the display device 10). In other embodiments, the material of the second microlenses ML2 is adjusted to reduce a refractive index n2' of the light L2 in the second microlenses ML2 (e.g., less than the refractive index n2 of the light L2 in the second microlenses ML2 in the display device 10). In some embodiments, both the material of the first microlenses ML1 and the material of the second microlenses ML2 are adjusted.

In this embodiment, under the light having the same wavelength, the refractive index of the first microlenses ML1 is greater than the refractive index of the second microlenses ML2, and the refractive index of the light L3 having the longer wavelength in the first microlenses ML1 is approximately equal to the refractive index of the light L2 having the shorter wavelength in second microlenses ML2. Based on this, the issue that a focus depth of the light L1 is deeper than a focus depth of the light L2 due to the fact that the third wavelength λ3 is greater than the second wavelength λ2 may be improved.

In addition, although in FIG. 3, the photosensitive device 100 is configured to receive the light L1, the light L2, and the light L3 having three different wavelengths, the disclosure is not limited thereto. In other embodiments, the photosensitive device is configured to receive at least two of the light L1, the light L2, and the light L3. In other words, in other embodiments, a method of disposing the microlenses includes at least two of the photosensitive elements overlapping with both the first microlenses ML1 and the second microlenses ML2, the photosensitive elements only overlapping with the first microlenses ML1, and the photosensitive elements only overlapping with the second microlenses ML2. In other words, the disclosure does not limit the photosensitive device 100 to have the three features of the photosensitive elements overlapping with both the first microlenses ML1 and the second microlenses ML2, the photosensitive elements only overlapping with the first microlenses ML1, and the photosensitive elements only overlapping with the second microlenses ML2 at the same time.

Figure 4:
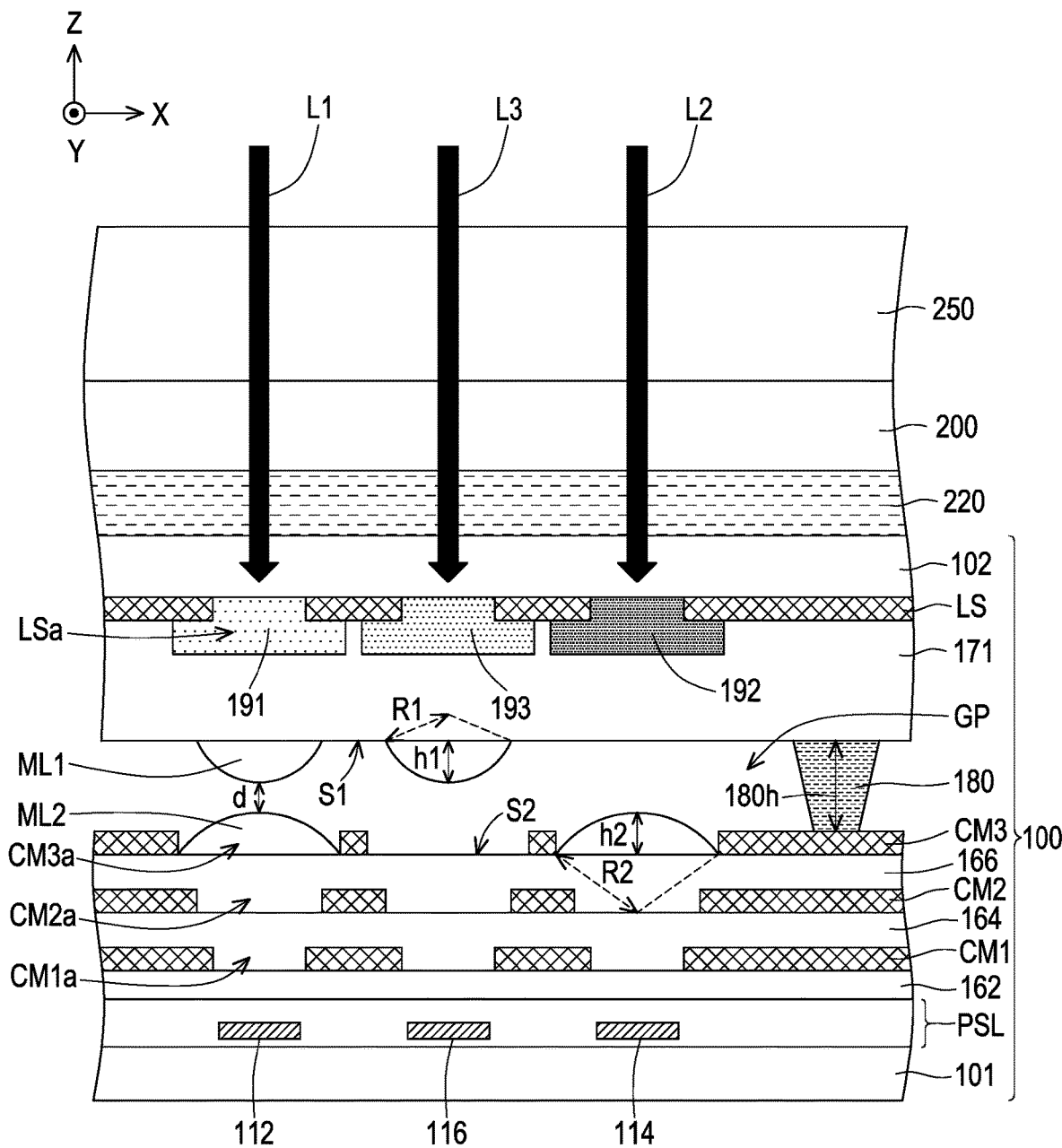
FIG. 4 is a schematic cross-sectional view of a display device according to an embodiment of the disclosure.

FIG. 4 is a schematic cross-sectional view of a display device according to an embodiment of the disclosure. It is noted that some of the reference numerals and descriptions of the embodiment of FIG. 1 will apply to the embodiment of FIG. 4. The same or similar reference numerals will represent the same or similar elements, and the descriptions of the same technical contents will be omitted. Reference may be made to the above embodiment for the omitted descriptions, which will not be repeated in the following embodiments.

A difference between a display device 30 of FIG. 4 and the display device 10 of FIG. 1 is that in the display device 30, the first side S1 of the gap GP where the first microlenses ML1 are disposed is the side of the gap GP close to the second substrate 102, and the second side S2 of the gap GP where the second microlenses ML2 are disposed is the side of the gap GP close to the first substrate 101.

In this embodiment, the first microlenses ML1 are disposed on the second substrate 102, and the second microlenses ML2 are disposed on the first substrate 101.

In this embodiment, the radius of curvature R1 of the first microlenses ML1 is less than the radius of curvature R2 of the second microlenses ML2. In this embodiment, the material of the first microlenses ML1 is the same as the material of the second microlenses ML2, but the disclosure is not limited thereto. In other embodiments, the material of the first microlenses ML1 is different from the material of the second microlenses ML2.

In addition, although in FIG. 4, the photosensitive device 100 is configured to receive the light L1, the light L2, and the light L3 having three different wavelengths, the disclosure is not limited thereto. In other embodiments, the photosensitive device is configured to receive at least two of the light L1, the light L2, and the light L3. In other words, in other embodiments, a method of disposing the microlenses includes at least two of the photosensitive elements overlapping with both the first microlenses ML1 and the second microlenses ML2, the photosensitive elements only overlapping with the first microlenses ML1, and the photosensitive elements only overlapping with the second microlenses ML2. In other words, the disclosure does not limit the photosensitive device 100 to have the three features of the photosensitive elements overlapping with both the first microlenses ML1 and the second microlenses ML2, the photosensitive elements only overlapping with the first microlenses ML1, and the photosensitive elements only overlapping with the second microlenses ML2 at the same time.

Figure 5:
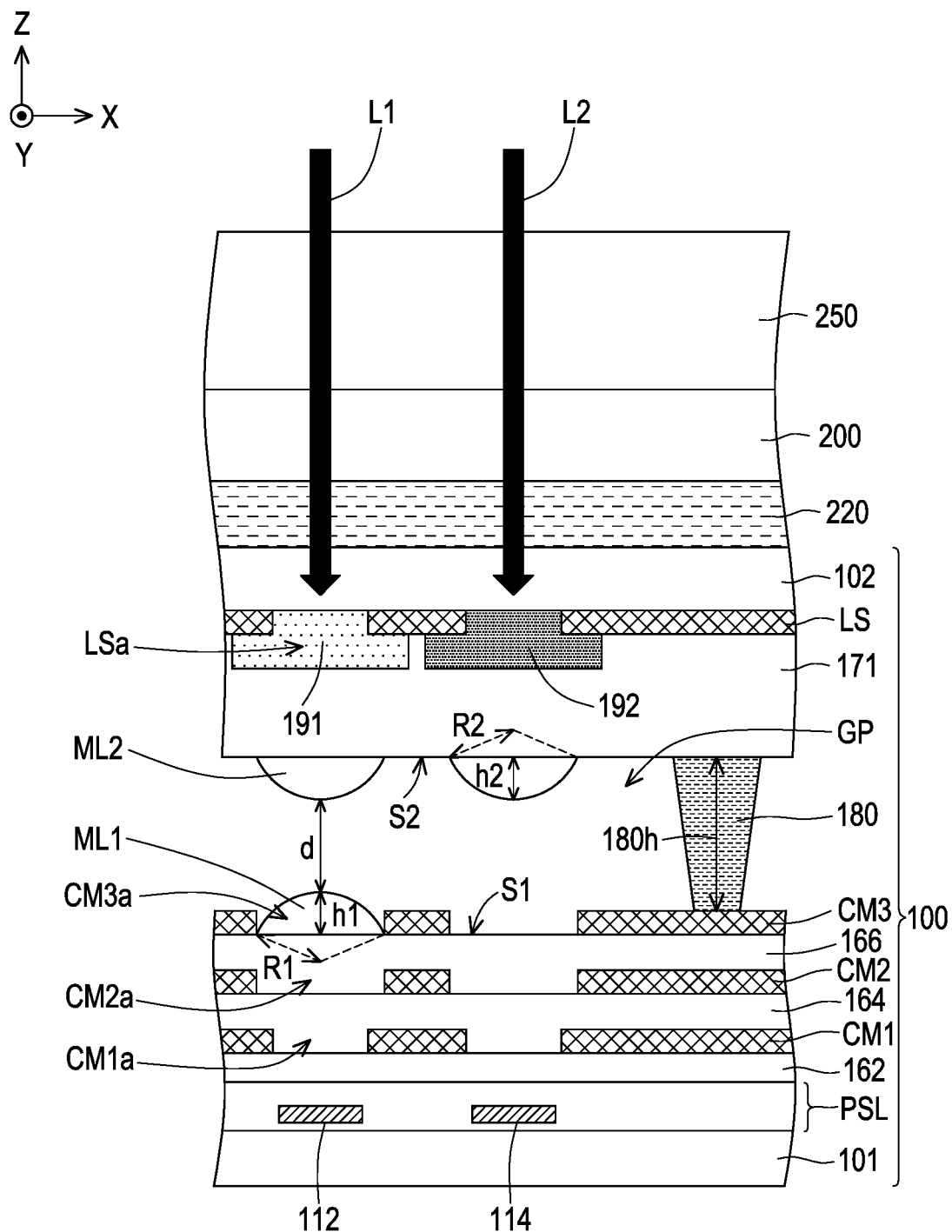
FIG. 5 is a schematic cross-sectional view of a display device according to an embodiment of the disclosure.

FIG. 5 is a schematic cross-sectional view of a display device according to an embodiment of the disclosure. It is noted that some of the reference numerals and descriptions of the embodiment of FIG. 1 will apply to the embodiment of FIG. 5. The same or similar reference numerals will represent the same or similar elements, and the descriptions of the same technical contents will be omitted. Reference may be made to the above embodiment for the omitted descriptions, which will not be repeated in the following embodiments.

A difference between a display device 40 of FIG. 5 and the display device 10 of FIG. 1 is that in the display device 40, the first photosensitive element 112 is overlapping with one of the first microlenses ML1 and one of the second microlenses ML2, and in a combination of the first photosensitive element 112 overlapping with the first microlenses ML1 and the second microlenses ML2, the vertical spacing d between the first microlenses ML1 and the second microlenses ML2 is equal to the focal length f1 of the first microlenses ML1 plus the focal length f2 of the second microlenses ML2.

In this embodiment, the first wavelength λ1 of the light L1 is greater than the second wavelength λ2 of the light L2. It may be known from Formula 2 that when the vertical spacing d is equal to the focal length f1 plus the focal length f2, the focal length f after the first microlenses ML1 and the second microlenses ML2 are combined together is nearly infinite. In other words, the combination of first microlenses ML1 and second microlenses ML2 may convert the light L1 into parallel light. In this embodiment, because the wavelength of the light L1 is too long, the microlenses exceed the process capability, and it is difficult to focus the light. However, through the combination of the first microlenses ML1 and the second microlenses ML2, the convergence of the light L1 may be improved, and the collimation effect may be obtained, thereby improving the imaging quality.

In this embodiment, the first microlenses ML1 are closer to the first photosensitive element 112 than the second microlenses ML2. The focal length f2 of the second microlenses ML2 is greater than the focal length f1 of the first microlenses ML1, and a magnification (M) of the combination of the first microlenses ML1 and the second microlenses ML2 is equal to −f1/f2, and −f1/f2 is less than −1. In this embodiment, the radius of curvature of the first microlenses ML1 is the same as the radius of curvature of the second microlenses ML2, but the disclosure is not limited thereto. In other embodiments, the radius of curvature of the first microlenses ML1 is different from the radius of curvature of the second microlenses ML2. In this embodiment, the material of the first microlenses ML1 is the same as the material of the second microlenses ML2, but the disclosure is not limited thereto. In other embodiments, the material of the first microlenses ML1 is different from the material of the second microlenses ML2.

In some embodiments, the height 180h of the supporting structure 180 is approximately equal to a sum of the vertical spacing d, the height h1 of the first microlenses ML1, and the height h2 of the second microlenses ML2, but the disclosure is not limited thereto. In other embodiments, the dummy first microlenses ML1 are disposed below the supporting structure 180, and the supporting structure 180 is located on the dummy first microlenses ML1. At this time, the height 180h of the supporting structure 180 is approximately equal to a sum of the vertical spacing d and the height h2 of the second microlenses ML2.

In addition, although in FIG. 5, the second photosensitive element 114 is overlapping with the first microlenses ML1, but is not overlapping with the second microlenses ML2. However, the disclosure is not limited thereto. In other embodiments, the second photosensitive element 114 is overlapping with the second microlenses ML2, but is not overlapping with the first microlenses ML1.

Based on the above, in the photosensitive device of the disclosure, by disposing the first microlenses and the second microlenses, the issue of different focus depths caused by the inconsistent wavelengths of the light may be improved, thereby enhancing the image sensing quality.

Figure 6:
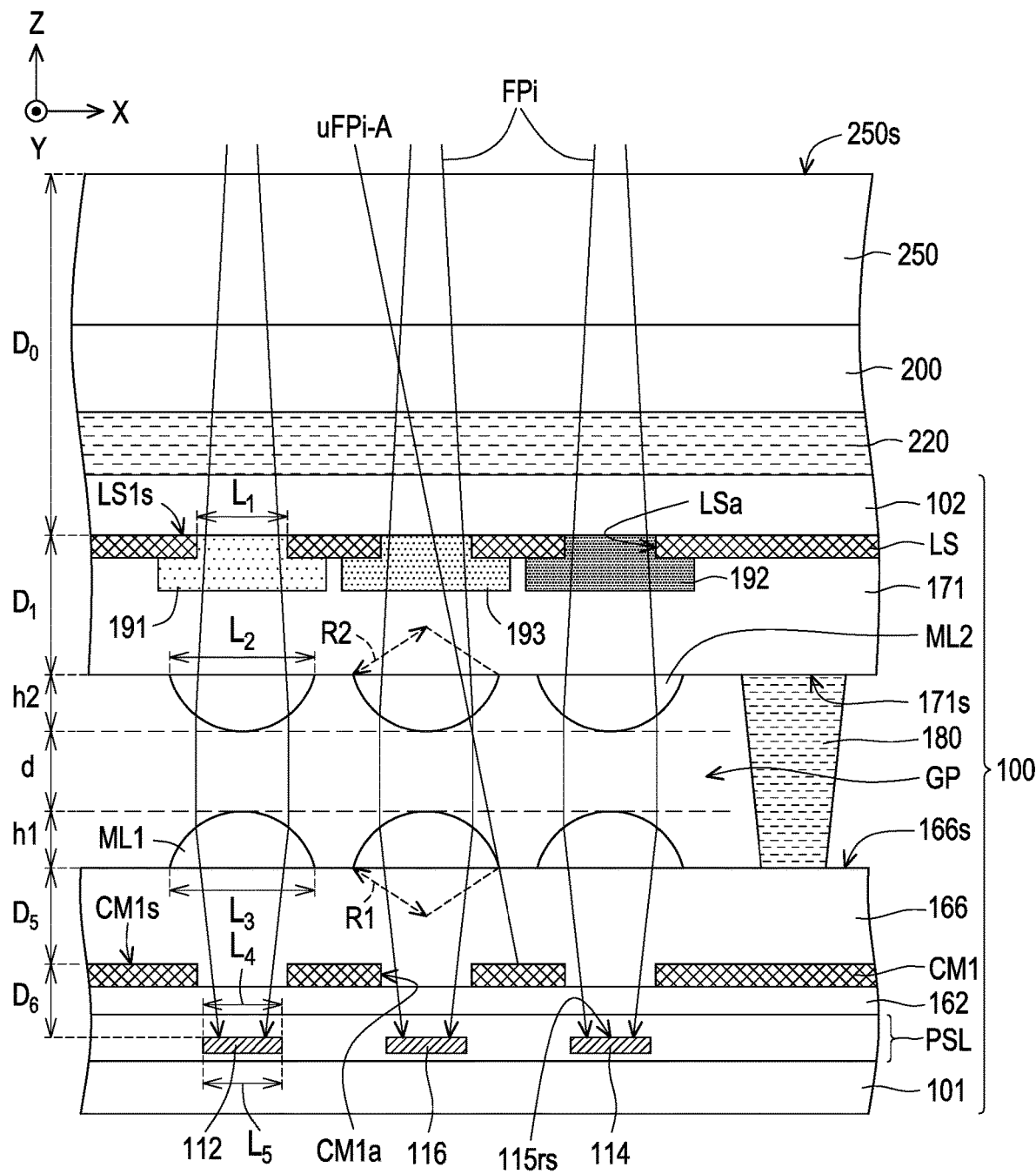
FIG. 6 is a schematic cross-sectional view of a display device according to an embodiment of the disclosure.

FIG. 6 is a schematic cross-sectional view of a display device according to an embodiment of the disclosure. It is noted that some of the reference numerals and descriptions of the embodiment of FIG. 1 will apply to the embodiment of FIG. 6. The same or similar reference numerals will represent the same or similar elements, and the descriptions of the same technical contents will be omitted. Reference may be made to the above embodiment for the omitted descriptions, which will not be repeated in the following embodiments.

Referring to FIG. 6, in this embodiment, the first photosensitive element 112, the second photosensitive element 114, and the third photosensitive element 116 are each overlapping with one of the first microlenses ML1 and one of the second microlenses ML2.

In this embodiment, the first microlenses ML1 and the second microlenses ML2 respectively have a first radius of curvature R1 and a second radius of curvature R2, and the first radius of curvature R1 and the second radius of curvature R2 may optionally be the same, but the disclosure is not limited thereto.

For example, a display device 50 may further be provided with the cover plate 250 on a side of the display panel 200 away from the photosensitive device 100 (or a side of the second substrate 102 away from the first substrate 101), and the cover plate 250 has a cover plate surface 250s away from the second substrate 102 (or the display panel 200). The light shielding pattern layer LS further has a surface LS1s facing the second substrate 102. There is a distance $D_0$ between the cover plate surface 250s of the cover plate 250 and the surface LS1s of the light shielding pattern layer LS, and there is a distance $D_1$ between a surface 171s of the cladding layer 171 and the surface LS1s of the light shielding pattern layer LS. The voids LSa of the light shielding pattern layer LS and the second microlenses ML2 respectively have a length $L_1$ and a length $L_2$ along an arrangement direction (e.g., the direction X). The second microlenses ML2 further have the height h2 along a direction perpendicular to the arrangement direction.

In an exemplary embodiment, the second radius of curvature R2 of the second microlenses ML2 may satisfy the following relational Formula:

$$\frac{D_0 + D_1}{2} \geq R2 \geq \frac{4h2^2 + L_2^2}{8h2},$$

and the length $L_1$ of the voids LSa may satisfy the following relational Formula:

$$L_2 \geq L_1 \geq \left(\frac{D_0}{D_0 + D_1}\right) \cdot L_2.$$

On the other hand, the first collimating structure CM1 further has a surface CM1s facing the gap GP. In this embodiment, the planar layer 166 is located on the surface CM1s of the first collimating structure CM1. The first photosensitive element 112 to the third photosensitive element 116 each have a light receiving surface 115rs facing the gap GP. There is a distance $D_5$ between a surface 166s of the planar layer 166 and the surface CM1s of the first collimating structure CM1, and there is a distance $D_6$ between the surface CM1s of the first collimating structure CM1 and the light receiving surfaces 115rs of the first photosensitive element 112 to the third photosensitive element 116. The first microlenses ML1 and the first voids CM1a respectively have a length L3 and a length L4 (i.e., an aperture) along the arrangement direction (e.g., the direction X). The first microlenses ML1 further have the height h1 along the direction perpendicular to the arrangement direction. The first photosensitive element 112 to the third photosensitive element 116 have a length $L_5$ along the direction X. The length $L_5$ here is, for example, defined by a length of an interface between the second electrode E2 of the first photosensitive element 112 to the third photosensitive element 116 and the photoelectric conversion layer PCL along the direction X.

In an exemplary embodiment, the first radius of curvature R1 of the first microlenses ML1 may satisfy the following relational Formula:

$$\frac{D_5+D_6}{2} \geq R1 \geq \frac{4h1^2+L_3^2}{8h1},$$

and the length $L_4$ of the first voids CM1a may satisfy the following relational Formula:

$$L_3 \geq L_4 \geq \left(\frac{D_5}{D_5+D_6}\right) \cdot L_3 \geq L_5.$$

It should be noted that multiple spacers 180 are further disposed between the cladding layer 171 and the flat planar 166, and the spacers 180, the surface 171s of the cladding layer 171, and the surface 166s of the planar layer 166 define the gap GP that may accommodate the microlenses. More specifically, the first microlenses ML1 and the second microlenses ML2 are spaced apart from one another in a normal direction (e.g., the direction Z) of the surface 171s of the cladding layer 171 due to the gap GP. The gap GP here may be a space filled with air, a specific gas, or in a near-vacuum state.

In this embodiment, the first microlenses ML1 and the second microlenses ML2 that are correspondingly disposed are spaced apart along the direction Z by the vertical spacing d, and the vertical distance d satisfies the following relational Formula:

$$d \geq 2\frac{R1 \times R2}{R1+R2}.$$

When the first radius of curvature R1 of the first microlenses ML1, the second radius of curvature R2 of the second microlenses ML2, and the vertical spacing d between the first microlenses ML1 and the second microlenses ML2 are designed within the above range, multiple streams of fingerprint image light FPi is transmitted in the form of parallel light in the gap GP. Therefore, a variation of a gap thickness (e.g. the vertical spacing d) of the gap GP does not affect the signal quality of the fingerprint image.

For example, the fingerprint image light FPi incident on the photosensitive device 100 at an appropriate angle passes through the first voids CM1a of the first collimating structure CM1 and is transmitted to the corresponding light receiving surfaces 115rs of the first photosensitive element 112 to the third photosensitive element 116 after passing through the voids LSa of the light shielding pattern layer LS and being refracted by the second microlenses ML2 and the first microlenses ML1. The light receiving surface 115rs here is defined by, for example, a surface of the second electrode E2 of the first photosensitive element 112 to the third photosensitive element 116 facing the second substrate 102. In other embodiments, the light receiving surface 115rs may also be defined by a surface of the photoelectric conversion layer PCL of the first photosensitive element 112 to the third photosensitive element 116 facing the second substrate 102.

On the contrary, a fingerprint image light uFPi-A (or an unintended external ambient light) incident on the photosensitive device 100 at a greater incident angle is blocked and may not be transmitted to the corresponding first photosensitive element 112 to third photosensitive element 116 after passing through the voids LSa of the light shielding pattern layer LS and being refracted by the second microlenses ML2. That is to say, the first microlenses ML1 and the second microlenses ML2 respectively disposed on the two substrates and corresponding to one another may reduce the incident angle of the light transmitted to the first photosensitive element 112 to the third photosensitive element 116. That is, a design of using the first microlenses ML1 together with the second microlenses ML2 may limit a light receiving range of the photosensitive device 100, and effectively suppress background noise (i.e., a sensing signal generated by the unintended light), so as to increase a signal-to-noise ratio (SNR) of a fingerprint signal. In addition, part of the light shielding pattern layer and the spacer layer (e.g., planar layer) therebetween used in a general fingerprint sensing module may also be replaced, which is helpful for simplifying a manufacturing process of the photosensitive device 100.

On the other hand, the first microlenses ML1 and the second microlenses ML2 in the disclosure are disposed between the first substrate 101 and the second substrate 102. Therefore, the microlenses may be prevented from being damaged by unintended impact or scratches in the subsequent process, which helps to increase a production yield rate and a process margin of the fingerprint sensing module.

In order to allow the photosensitive device 100 to have an anti-counterfeiting function, some of the voids LSa of the light shielding pattern layer LS may selectively be provided with multiple color filter patterns, for example, the first filter element 191, the second filter element 192, and the third filter element 193, but the disclosure is not limited thereto. In other embodiments, the fingerprint sensing module may not be provided with the color filter patterns.

It should be noted that since the photosensitive device 100 in the disclosure is not provided with the microlens on a side surface facing the display panel 200, it is suitable to adopt a direct bonding process to connect the display panel 200 and the photosensitive device 100. In this way, the phenomenon of multiple reflections of the light between the display panel 200 and the photosensitive device 100 may be reduced, thereby greatly improving a fingerprint sensing signal of the display device 50. For example, the photosensitive device 100 and the display panel 200 are bonded together by the optical adhesive layer 220 distributed over the entire surface.

What is claimed is:

1. A photosensitive device, comprising:
    a first substrate;
    a second substrate opposite to the first substrate, wherein there is a gap between the first substrate and the second substrate;
    a supporting structure located in the gap between the first substrate and the second substrate;
    a plurality of first microlenses and a plurality of second microlenses respectively disposed on a first side and a second side of the gap, wherein a pitch of the plurality of first microlenses and a pitch of the plurality of second microlenses are different;
    a first photosensitive element overlapping with one of the plurality of first microlenses and one of the plurality of second microlenses;
    a second photosensitive element overlapping with another one of the plurality of second microlenses;
    a first filter element overlapping with the first photosensitive element;

a second filter element overlapping with the second photosensitive element; and
a collimating structure located between the first substrate and the plurality of first microlenses, wherein the one of the plurality of first microlenses and the one of the plurality of second microlenses are located between the first photosensitive element and the first filter element, and the another one of the plurality of second microlenses is located between the second photosensitive element and the second filter element.

2. The photosensitive device according to claim 1, wherein the second photosensitive element is not overlapping with the plurality of first microlenses.

3. The photosensitive device according to claim 2, further comprising:
a third photosensitive element overlapping with another one of the plurality of first microlenses and not overlapping with the plurality of second microlenses.

4. The photosensitive device according to claim 3, wherein the first filter element is configured to enable a light having a first wavelength to pass through,
the second filter element is configured to enable the light having a second wavelength to pass through, the photosensitive device further comprises:
a third filter element overlapping with the third photosensitive element and configured to enable the light having a third wavelength to pass through, wherein the first wavelength is greater than the third wavelength, and the third wavelength is greater than the second wavelength.

5. The photosensitive device according to claim 1, wherein a radius of curvature of each of the plurality of second microlenses is greater than a radius of curvature of each of the plurality of first microlenses.

6. The photosensitive device according to claim 5, wherein a material of each of the plurality of first microlenses is the same as a material of each of the plurality of second microlenses.

7. The photosensitive device according to claim 1, wherein under a light having a same wavelength, a refractive index of each of the plurality of first microlenses is greater than a refractive index of each of the plurality of second microlenses.

8. The photosensitive device according to claim 7, wherein a radius of curvature of the plurality of each of first microlenses is equal to a radius of curvature of each of the plurality of second microlenses.

9. The photosensitive device according to claim 1, wherein a vertical spacing (d) between the plurality of first microlenses and the plurality of second microlenses is less than 1 micrometer.

10. The photosensitive device according to claim 1, wherein the plurality of first microlenses are closer to the first photosensitive element than the plurality of second microlenses, a vertical spacing (d) between the plurality of first microlenses and the plurality of second microlenses is equal to a focal length (f1) of the plurality of first microlenses plus a focal length (f2) of the plurality of second microlenses, and the focal length (f2) is greater than the focal length (f1).

11. The photosensitive device according to claim 1, wherein the second photosensitive element is overlapping with another one of the plurality of first microlenses.

12. A photosensitive device, comprising:
a first substrate;
a second substrate opposite to the first substrate, wherein there is a gap between the first substrate and the second substrate;
a plurality of first microlenses and a plurality of second microlenses respectively disposed on a first side and a second side of the gap, wherein a material of each of the plurality of first microlenses is different from a material of each of the plurality of second microlenses, a pitch of the plurality of first microlenses and a pitch of the plurality of second microlenses are different, and/or a radius of curvature of each of the plurality of first microlenses is different from a radius of curvature of each of the plurality of second microlenses;
a first photosensitive element overlapping with one of the plurality of first microlenses;
a second photosensitive element overlapping with one of the plurality of second microlenses;
a first filter element overlapping with the first photosensitive element; and
a second filter element overlapping with the second photosensitive element, wherein the one of the plurality of first microlenses is located between the first photosensitive element and the first filter element, and the one of the plurality of second microlenses is located between the second photosensitive element and the second filter element.

13. The photosensitive device according to claim 12, wherein the first photosensitive element and the second photosensitive element are located on the first substrate, the first side of the gap is a side of the gap close to the first substrate, and the second side of the gap is a side of the gap close to the second substrate.

14. The photosensitive device according to claim 12, wherein the first photosensitive element and the second photosensitive element are located on the first substrate, the first side of the gap is close to the second substrate, and the second side of the gap is close to the first substrate.

15. The photosensitive device according to claim 12, wherein the first photosensitive element is overlapping with the one of the plurality of first microlenses and another one of the plurality of second microlenses, the plurality of first microlenses are closer to the first photosensitive element than the plurality of second microlenses, a vertical spacing (d) between the plurality of first microlenses and the plurality of second microlenses is equal to a focal length (f1) of the plurality of first microlenses plus a focal length (f2) of the plurality of second microlenses, and the focal length (f2) is greater than the focal length (f1).

16. The photosensitive device according to claim 1, wherein an orthographic projection of the second photosensitive element on the first substrate does not overlap an orthographic projection of all of the plurality of first microlens on the first substrate.

17. The photosensitive device according to claim 12, wherein an orthographic projection of the second photosensitive element on the first substrate does not overlap an orthographic projection of all of the plurality of first microlens on the first substrate.

* * * * *